US007880541B1

(12) United States Patent
Golden

(10) Patent No.: US 7,880,541 B1
(45) Date of Patent: Feb. 1, 2011

(54) LOW NOISE, LOW POWER INSTRUMENTATION AMPLIFIER

(75) Inventor: Philip V. Golden, Menlo Park, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/627,959

(22) Filed: Nov. 30, 2009

Related U.S. Application Data

(60) Provisional application No. 61/234,962, filed on Aug. 18, 2009, provisional application No. 61/250,992, filed on Oct. 13, 2009.

(51) Int. Cl.
*H03F 3/45* (2006.01)
(52) U.S. Cl. .......................... 330/69; 330/302; 330/306
(58) Field of Classification Search .................. 330/69, 330/302, 306
See application file for complete search history.

(56) References Cited

U.S. PATENT DOCUMENTS

| | | | | | |
|---|---|---|---|---|---|
| 5,377,274 | A | * | 12/1994 | Meyer et al. | 381/59 |
| 5,440,817 | A | * | 8/1995 | Watson et al. | 33/366.15 |
| 5,564,429 | A | * | 10/1996 | Bornn et al. | 600/508 |
| 5,568,561 | A | * | 10/1996 | Whitlock | 381/120 |
| 6,514,689 | B2 | * | 2/2003 | Han et al. | 435/4 |
| 6,590,983 | B1 | * | 7/2003 | Kraemer | 381/17 |
| 7,253,680 | B2 | * | 8/2007 | Laletin | 330/69 |
| 7,598,716 | B2 | * | 10/2009 | Schlueter et al. | 323/280 |

OTHER PUBLICATIONS

"Instrumentation Amplifier," http://en.wikipedia.org/wiki/Instrumentation_amplifier, 2 pages, accessed Nov. 25, 2009.
"High Common-Mode Voltage, Programmable Gain Difference Amplifier," Analog Devices, Inc., AD628, 20 pages, 2002-2007.
"Single, Dual, and Quad Micropower, Zero-Drift, RRIO Operational Amplifiers," Intersil Americas Inc., Intersil Data Sheet FN6560.1, May 29, 2009.
"3 Op Amp Instrumentation Amplifier," http://www.ecircuitcenter.com/Circuits/instamp1/instamp1.htm, eCircuit Center, 2002.

* cited by examiner

*Primary Examiner*—Patricia Nguyen
(74) *Attorney, Agent, or Firm*—Fliesler Meyer LLP

(57) ABSTRACT

An instrumentation amplifier includes a pair of buffered operational amplifiers that accept a pair of input signals, and a differential operational amplifier that outputs an output signal indicative of a difference between the input signals. A low pass filter provides passive band limiting of the output signal. Each operational amplifier is implemented as a multi-path amplifier that includes a low frequency path and a high frequency path between an input and an output of the operational amplifier. Further, each multi-path amplifier includes a differential input transconductance stage within the low frequency path and a differential input transconductance stage within the high frequency path. Within each multi-path amplifier, the differential input transconductance stage of the high frequency path is noisier than, but consumes less power than, the differential input transconductance stage of the low frequency path. Each multi-path amplifier provides noise shaping that results in an increase in noise above a crossover frequency of the multi-path amplifier.

23 Claims, 7 Drawing Sheets

US 7,880,541 B1

LOW NOISE, LOW POWER INSTRUMENTATION AMPLIFIER

PRIORITY CLAIM

The present application claims priority under 35 U.S.C. 119(e) to U.S. Provisional Patent Application No. 61/234,962, entitled "Low Noise, Low Power Instrumentation Amplifier", filed Aug. 18, 2009 and U.S. Provisional Patent Application No. 61/250,992, entitled "Low Noise, Low Power Instrumentation Amplifier", filed Oct. 13, 2009, each of which is incorporated herein by reference.

FIELD OF INVENTION

The present invention relates to amplifiers, methods for use therewith, and circuits that include amplifiers.

BACKGROUND

FIG. 1 illustrates a conventional instrumentation amplifier 102 that includes buffered operational amplifiers OP1 and OP2 (also referred to as input buffers), and a differential operational amplifier OP3. The input buffers OP1 and OP2 provide a high input impedance, and eliminate the need for input impedance matching, thereby making the instrumentation amplifier 102 very useful for measurement and test equipment. For example, the instrumentation amplifier 102 is very useful for measuring the output of a sensor, such as, but not limited to, a strain gauge, photo detector, thermistor, thermocouple, temperature sensor, level sensor, current sensor, biometric sensor and Hall effect sensor. More generally, an instrumentation amplifier is useful for amplifying a relatively small differential signal that is superimposed on a relatively large common mode signal (e.g., a DC signal). This is because an instrumentation amplifier amplifies the difference between its two inputs (V1 and V2) while rejecting the signal that is common to the two inputs, to thereby produce its output (Vout).

Each operational amplifier of the instrumentation amplifier 102 can be implemented as a multi-path amplifier (sometimes referred to as a "feed-forward" amplifier), that includes separate low and high frequency feed-forward paths. Exemplary multi-path amplifiers 212B and 212C are shown in FIGS. 2B and 2C, respectively. Referring first to FIG. 2A, the multi-path amplifier 212A is generally shown as having a low frequency path including at least transconductance stages Gms, Gmi and Gmout, and a high frequency path including transconductance stage Gmf. Each transconductor stage (e.g., Gms, Gmi, Gmout and Gmf) can also be referred to simply as a transconductor. The capacitors Ccs and Ccf provide for parallel integration paths for low and high frequency.

Each of the transconductance stages in FIG. 2 is assumed to have a very high (but finite) output impedance. The unity gain frequency for the low frequency path is proportional to Gms/Ccs. The unity gain frequency for the high frequency path is proportional to Gmf/Ccf. Setting Gms/Ccs=Gmf/Ccf allows for a clean 20 dB/decade roll-off for the overall open loop transfer, which is a very desirable characteristic for the amplifier. FIG. 2B illustrates a specific implementation of a multi-path amplifier 212B. The multi-path amplifier 212B can be referred to as "3-stage multi-path" amplifier, because there are three transconductance stages in the low frequency path, and there are multiple paths between the input and output of the amplifier 212B. FIG. 2C illustrates an exemplary 4-stage multi-path amplifier 212C. Depending on implementation, additional transconductance stages can be added, as can choppers, filters, etc.

In multi-path amplifiers, such as those in FIGS. 2A, 2B and 2C (but not limited thereto), the transconductances Gms and Gmf (of the differential input transconductance stages of the low and high frequency paths) are conventionally set such that they are equal in order to give a flat voltage noise response over frequency up to the bandwidth of the amplifier. Here it is assumed that the low frequency (e.g. 1/f) noise is negligible, this can be achieved using circuit techniques such as chopping. Stated another way, Gms=Gmf. Further, the capacitors Ccs and Ccf are conventionally set such that they are equal, i.e., Ccs=Ccf. This also results in Gms/Ccs=Gmf/Ccf.

FIG. 3 illustrates the flat noise spectral density response of a conventional instrumentation amplifier (e.g., 102 in FIG. 1) that is implemented using multi-path amplifiers (e.g., 212A, 212B or 212C in FIGS. 2A, 2B and 2C) having the conventional transconductance and capacitor values just described above. Here it is assumed that the low frequency (e.g. 1/f) noise is negligible, which can be achieved using circuit techniques such as chopping. Additionally, an infinite bandwidth is assumed, and only the ideal white noise profile of the amplifier is represented.

While the flat frequency response shown in FIG. 3 is sometimes desirable, other responses may be acceptable or desirable, depending on the application. Further, depending on the application and/or the larger circuit in which an instrumentation amplifier is incorporated, it may be desirable to reduce the current and power drawn by an instrumentation amplifier. For example, where an instrumentation amplifier is incorporated into a portable device that draws current and power from a battery, it would be beneficial to reduce the current and power drawn from the battery, to thereby increase the time between battery charges or replacement.

SUMMARY

A circuit of an embodiment of the present invention includes an instrumentation amplifier including a pair of buffered operational amplifiers that accept a pair of input signals, and a differential operational amplifier that outputs an output signal indicative of a difference between the pair of input signals. Additionally, the circuit includes a low pass filter configured to provide band limiting of the output signal. Each of the buffered operational amplifiers and the differential operational amplifier are implemented as a multi-path amplifier that includes a low frequency path and a high frequency path between an input and an output of the operational amplifier. Further, each of the multi-path amplifiers includes a differential input transconductance stage within the low frequency path and a differential input transconductance stage within the high frequency path. Within each of the multi-path amplifiers, the differential input transconductance stage of the high frequency path is noisier than, but consumes less power than, the differential input transconductance stage of the low frequency path. In accordance with an embodiment, each of the multi-path amplifiers provides noise shaping that results in an increase in output noise above a crossover frequency of the multi-path amplifier, wherein the crossover frequency is dependent on the relative open loop gain of the low frequency path of the multi-path amplifier compared to the open loop gain of the high frequency path. At frequencies below the crossover frequency, the open loop gain of the low frequency path is higher, and thus the noise from the low frequency path dominates the output noise. At frequencies above the crossover frequency the open loop gain of the high frequency path is higher, and thus the noise from the high frequency path dominates the output noise.

In accordance with an embodiment, the circuit also includes switches configured to selectively disable the band limiting provided by the low pass filter and the noise shaping provided by the multi-path amplifiers, to thereby provide a flat frequency response for the output signal. Such switches can be controlled by a switch controller, in an embodiment. Less current and power is drawn when the circuit provides noise shaping and band limiting, as compared to when the circuit provides a flat frequency response for the output signal.

In accordance with an embodiment, the band limiting provided by the low pass filter filters out noise above a frequency of interest so that at least a majority of noise generated by the differential input transconductance stage of the high frequency path is filtered out. For example, the low pass filter can include capacitors that define an RC pole that specifies a low pass cutoff frequency. In an embodiment, the RC pole is equal to a crossover frequency defined in part by the transconductances of the multi-path amplifiers. In another embodiment, the RC pole is less than a crossover frequency defined in part by the transconductances of the multi-path amplifiers. In still another embodiment, the RC pole is greater than a crossover frequency defined in part by the transconductances of the multi-path amplifiers. More generally, the low pass filter can specify that its cutoff frequency is equal to, less than or greater than the crossover frequency.

An embodiment of the present invention is also direct to a method for performing noise shaping and band limiting, where the method is for use with an instrumentation amplifier including a pair of buffered operational amplifiers that accept a pair of input signals, and a differential operational amplifier that outputs an output signal indicative of a difference between the pair of input signals. Noise shaping is performed within each of the operational amplifiers, which results in an increase in noise above a crossover frequency. Additionally, passive band limiting of the output signal is performed to thereby filter out noise above a cutoff frequency. Less current and power is drawn when such noise shaping and band limiting at is performed, as compared to when the circuit provides a flat frequency response for the output signal. Depending on the implementation and desired response, the cutoff frequency can be equal to, less than, or greater than, the crossover frequency. In accordance with an embodiment, the noise shaping and the band limiting can be selectively disabled, e.g., using switches, to thereby selectively provide a flat frequency response for the output signal.

Further embodiments, and the features, aspects, and advantages of the present invention will become more apparent from the detailed description set forth below, the drawings and the claims.

DETAILED DESCRIPTION

Figure 1:
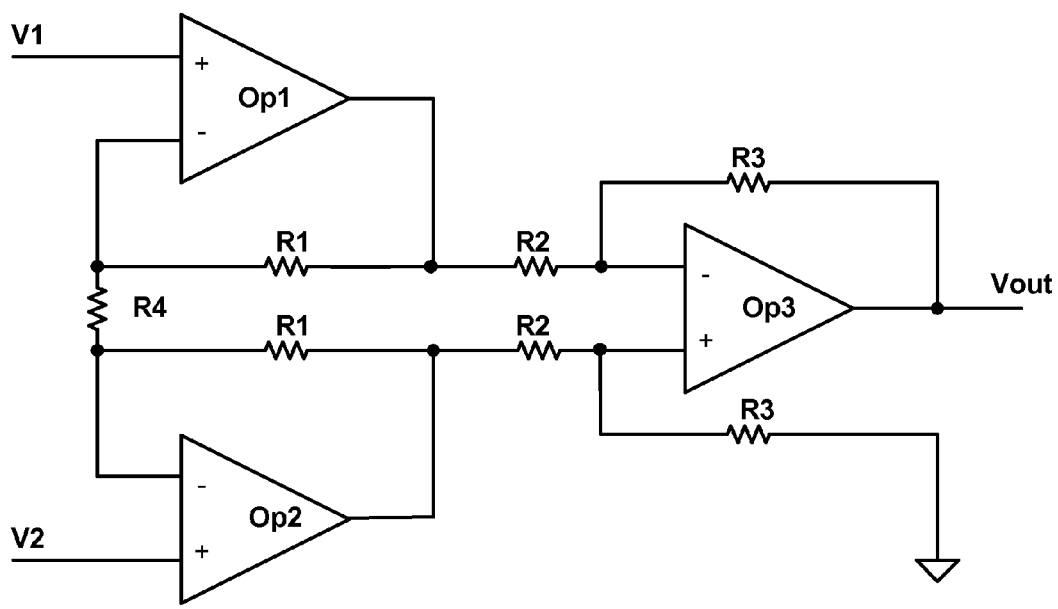
FIG. 1 illustrates a conventional "three amplifier" instrumentation amplifier including three operational amplifiers, two of which are connected as buffered operational amplifiers, and one of which is connected as a differential operational amplifier.
Figure 2A:
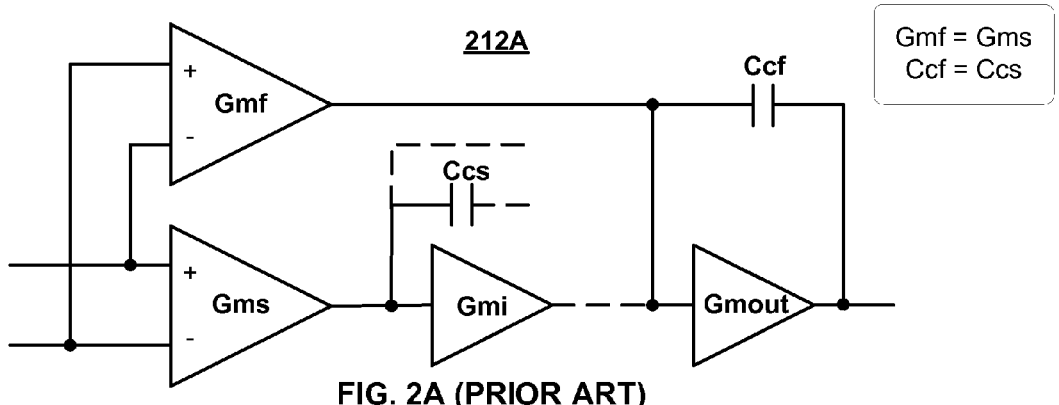
FIG. 2A illustrates a general case of a multi path operational amplifier.
Figure 2B:
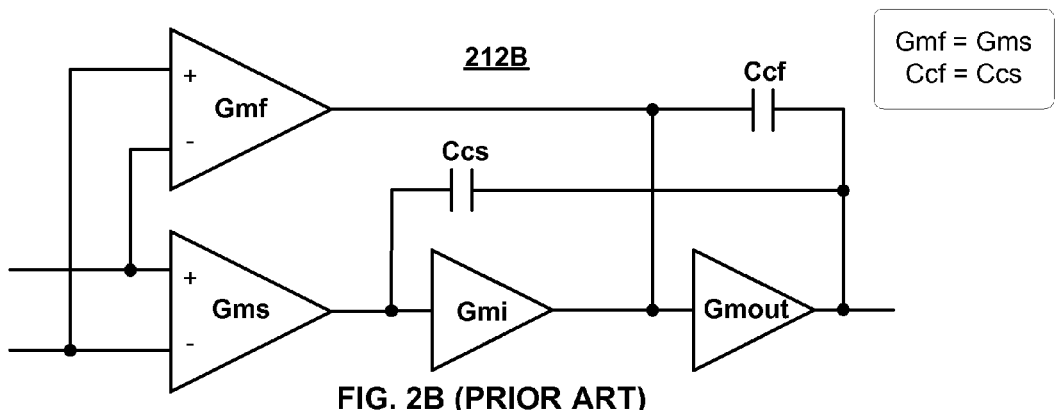
FIGS. 2B and 2C illustrate two different exemplary multi-path amplifier configurations, each of which can be used to implement all three of the operational amplifiers shown in FIG. 1.
Figure 2C:
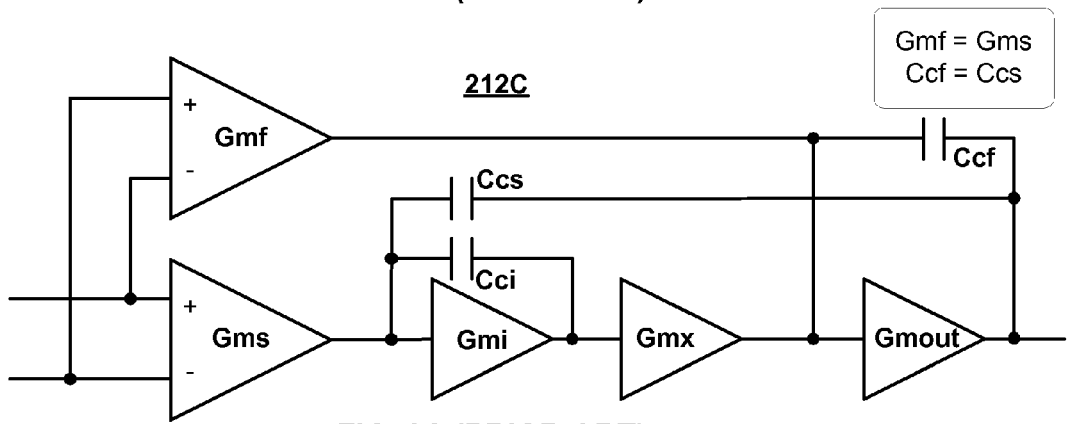
Figure 4:
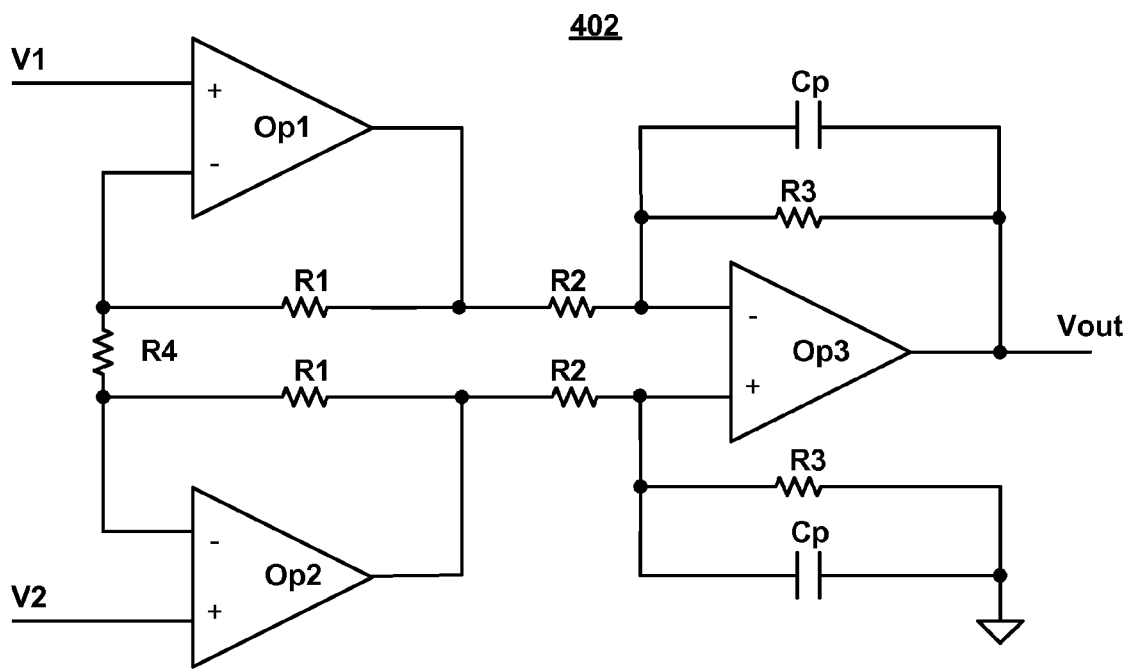
FIG. 4 illustrates an instrumentation amplifier, that includes passive low pass filtering, in accordance with an exemplary specific embodiment of the present invention.
Figure 5:
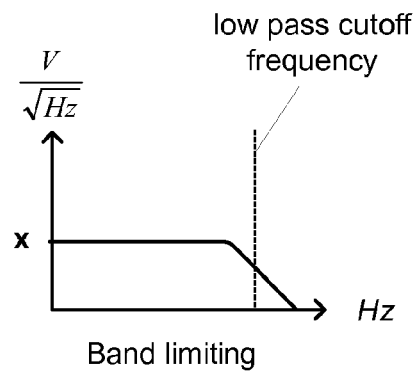
FIG. 5 illustrates the output noise spectral density response obtained by the instrumentation amplifier with passive low pass filtering of FIG. 4, where conventional transconductance and capacitor values are used.

FIG. 4 illustrates an instrumentation amplifier 402, that include passive low pass filtering (also referred to as passive band limiting), in accordance with an embodiment of the present invention. The instrumentation amplifier 402 resembles the instrumentation amplifier 102 of FIG. 1, but with capacitors Cp added in parallel with the resistors R3. Each operational amplifier of the instrumentation amplifier 402 can be a multi-path amplifier (examples of which were discussed with reference to FIGS. 2A, 2B and 2C), where Gms=Gmf and Ccs=Ccf. The added capacitors Cp cause band limiting (and more specifically, low pass filtering) of the output of the instrumentation amplifier, as can be appreciated from the resulting noise spectral density response shown in FIG. 5. Because the capacitors Cp are passive devices, the band limiting is passive band limiting. The RC pole frequency, illustrated by a dashed line in FIG. 5, equals $1/(R3*Cp)$ radians. The instrumentation amplifier 402 can be especially useful where frequencies below a specified frequency (defined by the RC pole) are the frequencies of interest. The adding of the capacitors Cp is only one exemplary way that an RC pole can be provided to add passive band limiting of the output of the instrumentation amplifier. More generally, a low pass filter is added, which is configured to low pass filter the output of the instrumentation amplifier.

One of ordinary skill in the art would appreciate from this description that there are numerous alternative ways to implement such a low pass filter that are also within the scope of the present invention. For example, it is also within the scope of the present invention that the low pass filter be implemented within the differential operational amplifier OP3.

Further, it is noted that the differential operational amplifier OP3 could have a differential output (i.e., a pair of output terminals), instead of a single ended output. In that cause, the output signal of the instrumentation amplifier would be a differential output signal. Further, in that case, e.g., the resistor R3 and the capacitor Cp that are shown in FIG. 4 as being connected between the non-inverting (+) input of the differential operational amplifier OP3 and ground, could instead be connected between the non-inverting (+) input of the differential operational amplifier OP3 and the further output terminal of the differential operational amplifier OP3.

Figure 6A:
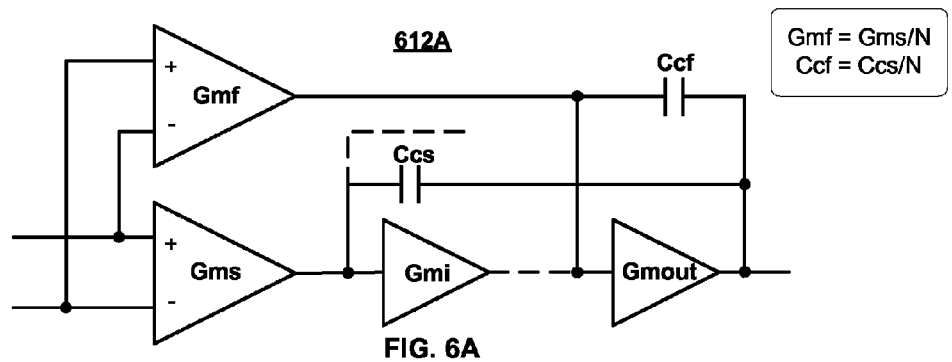
FIG. 6A illustrates a general case of a multi path operational amplifier with transconductance and capacitor values selected to provide noise shaping, in accordance with an embodiment of the present invention.
Figure 6B:
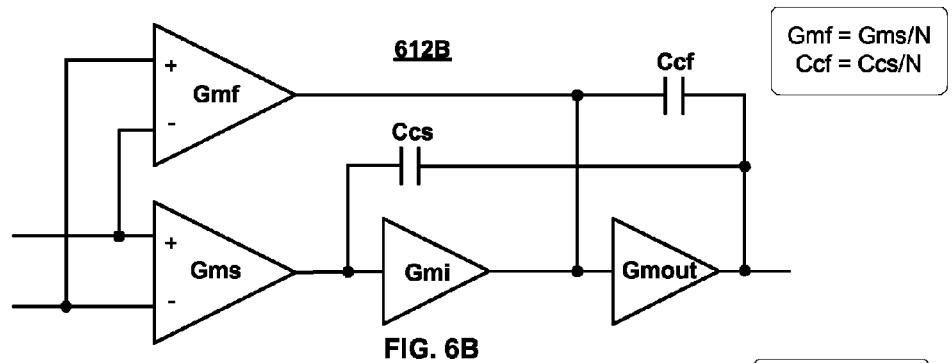
FIGS. 6B and 6C illustrate two different exemplary multi-path amplifier configurations with transconductance and capacitor values selected to provide noise shaping, in accordance with an embodiment of the present invention.
Figure 6C:
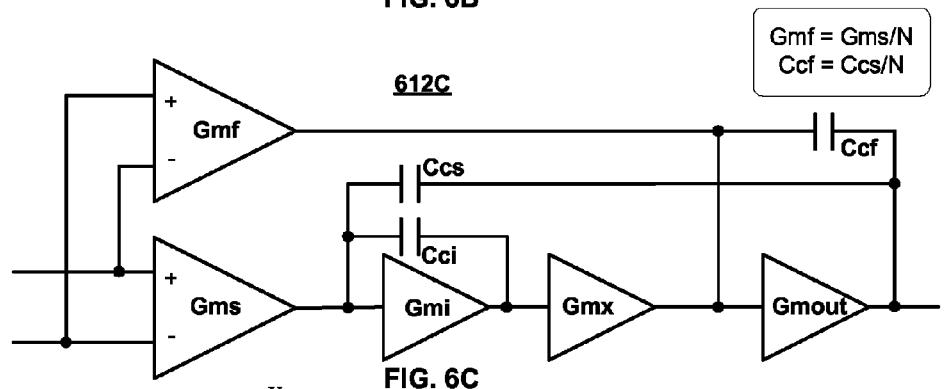

In accordance with an embodiment of the present invention, each operational amplifier (i.e., Op1, Op2 and Op3) of the instrumentation amplifier 402 is a multi-path amplifier that provides noise shaping, such that noise increases above a specified frequency. FIGS. 6A, 6B and 6C illustrate different exemplary multi-path amplifier configurations 612A, 612B and 612C, respectively, with transconductance and capacitor values selected to provide noise shaping, in accordance with an embodiment of the present invention. In these configurations, Gmf=Gms/N and Ccf=Ccs/N, where N>1. Preferably N is at least 5, but can be significantly greater. Note that the Ccf is reduced by the same amount (e.g., N) as Gmf, so that time constants of integrations performed by the low and high frequency paths remain the same. More generally, the ratio Gmf/Ccf should remain equal to the ratio Gms/Gmc, to provide the same integration time constants, which provides a smooth roll-off at the crossover frequency for the overall amplifier.

The input referred voltage noise of a transconductance stage is roughly ~

$$\sqrt{\frac{1}{Gm}}.$$

Figure 7:
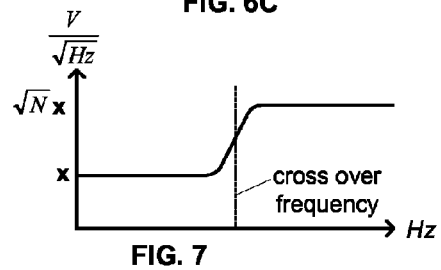
FIG. 7 illustrates a noise spectral density response obtained by an instrumentation amplifier resembling that of FIG. 1, implemented using one of the exemplary multi-path amplifiers in FIGS. 6A, 6B and 6C with transconductance and capacitor values selected to provide noise shaping, in accordance with an embodiment of the present invention.

Thus, if Gmf=Gms/N, then when referred to the output the voltage noise produced by Gmf will be ~$\sqrt{N}$ greater than the noise produced by Gms. For example, if N=9, then Gmf=Gms/9, and the noise generated by Gmf will be ~3 times greater than the noise generated by Gms. Thus, in this example, if the noise generated by Gms=x, then the noise generated by Gmf ~3*x, or more generally, ~$\sqrt{N}$*x. Such an output voltage noise spectral density response is shown in FIG. 7. More specifically, FIG. 7 illustrates a noise spectral density response obtained by an instrumentation amplifier resembling that of FIG. 1, implemented using one of the exemplary multi-path amplifiers in FIGS. 6A, 6B and 6C with transconductance and capacitor values selected to provide noise shaping, in accordance with an embodiment of the present invention. The crossover frequency, illustrated by a dashed line in FIG. 7, is dependent on the relative open loop gain of the low frequency path of the multi-path amplifier compared to the open loop gain of the high frequency path. At frequencies below the crossover frequency, the open loop gain of the low frequency path is higher, and thus the noise from the low frequency path dominates the output noise. At frequencies above the crossover frequency the open loop gain of the high frequency path is higher, and this the noise from the high frequency path dominates the output noise.

Because Gmf is N times smaller than Gmc, and Ccf is N times smaller than Ccs, the high frequency path of each of the multi-path amplifier configurations 612A, 612B and 612C will draw less current and thus consume less power (a factor of approximately N less power for a bipolar or subthreshold MOSFET transconductance) than the low frequency paths. This is illustrative of a noise versus power consumption tradeoff. As will be described below, an embodiment of the present invention takes advantage of this noise versus power consumption trade-off.

As indicated in FIGS. 6A, 6B and 6C, the transconductance of Gmf is a factor of N smaller than the transconductance of Gms. This can be accomplished by a simple rationing of the bias currents to the two transconductors Gmf and Gms, but is not limited thereto.

Figure 8:
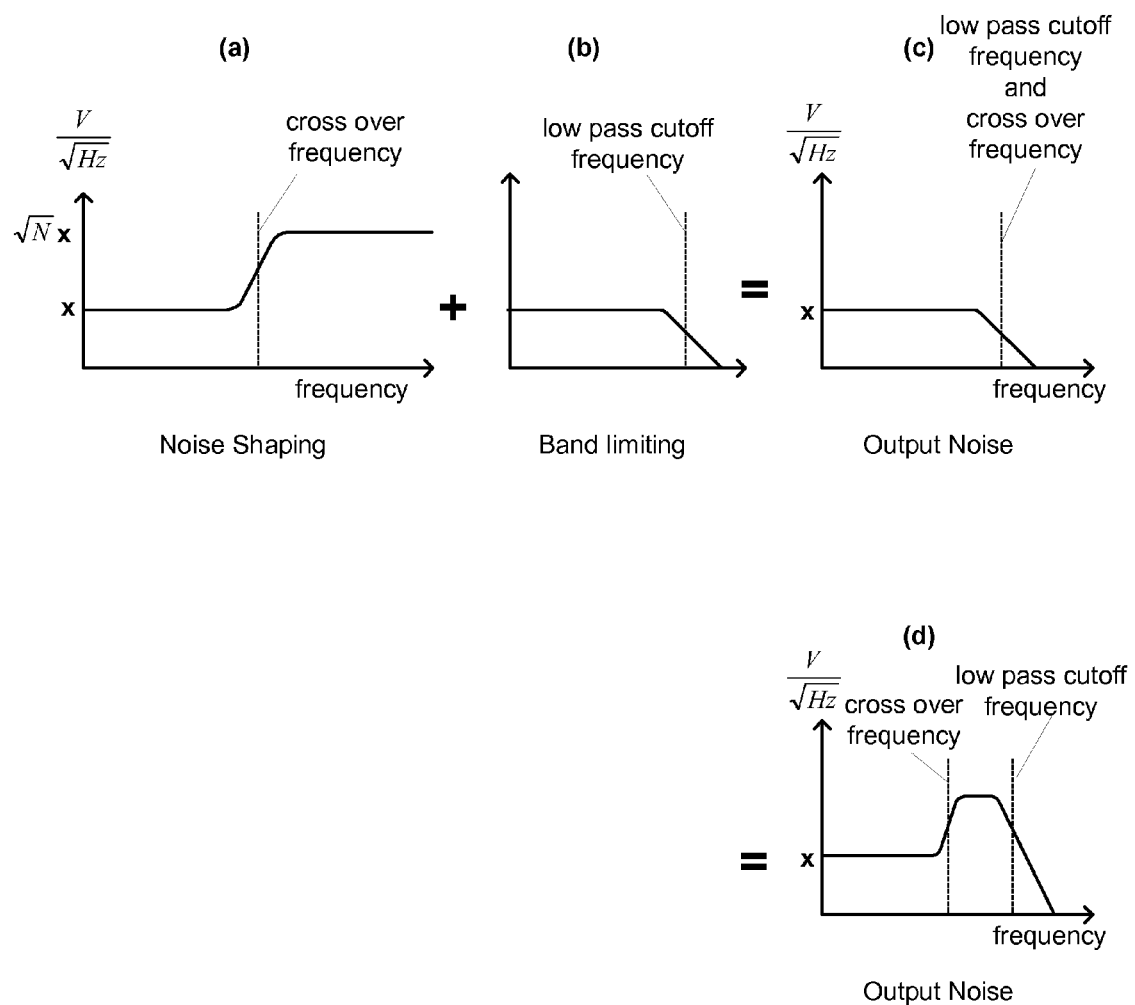
FIG. 8 illustrates how the noise shaping explained with reference to FIGS. 6A, 6B and 6C can be combined with the passive low pass filtering explained with reference to FIG. 4, to provide an instrumentation amplifier with improved noise versus power tradeoff, in accordance with an embodiment of the present invention.

FIG. 8 will now be used to explain how the noise shaping explained with reference to FIGS. 6A, 6B and 6C can be combined with the passive low pass filtering explained with reference to FIG. 4, to provide an instrumentation amplifier with improved output voltage noise versus power tradeoff, in accordance with an embodiment of the present invention. More specifically, by making the transconductance of Gmf N times smaller than the transconductance of Gmc, and making the capacitance of Ccf N times smaller than the capacitance of Ccs, the high frequency paths of the multi-path amplifiers 402 (used to implement Op1, Op2 and Op3) in FIG. 4, will draw less current and thus consume less power than the low frequency paths, but will produce more noise as can be appreciated from the noise spectral response (a) shown in FIG. 8. This increase in noise at frequencies above the crossover frequency is acceptable, since a low pass filter (e.g., including the capacitors Cp in FIG. 4) is used to filter out frequencies above a low pass cutoff frequency. More specifically, by setting the cutoff frequency (e.g., an RC pole frequency) to be equal to (or lower than) the crossover frequency, the noise spectral frequency response shown in (c) of FIG. 8 is achieved.

The crossover frequency, as the term is used herein, is the frequency below which the noise of the low frequency path of a multi-path amplifier dominates the input referred noise, and above which the noise of the high frequency path of the multi-path amplifier dominates the input referred noise. In graph (c) of FIG. 8, the RC pole frequency is shown as being set such that it is the same as the crossover frequency. However, as mentioned above, it is also within the scope of the present invention for the RC pole to be set such that it is below the crossover frequency. This can advantageously allow the signal to noise ratio of an instrumentation amplifier to be improved where only extremely low frequency signals (e.g., signals having a frequency of 2 kHz or lower) need to be processed by the instrumentation amplifier.

Conversely, if the signals to be processed by the instrumentation amplifier are comparable to the crossover frequency (e.g., if the signal being processed has signal content at frequencies greater than half of the crossover frequency), then the RC pole can be extended beyond the cross over frequency (i.e., the RC pole frequency can be greater than the crossover frequency). While this can result in a bump in the noise spectrum, as shown in (d) of FIG. 8, the overall signal to noise ratio can be improved. Accordingly, it is also within the scope of the present invention for the RC pole to be set such that it is above the crossover frequency. Alternative configurations for setting the low pass cutoff frequency are also within the scope of the present invention, as mentioned above.

Figure 3:
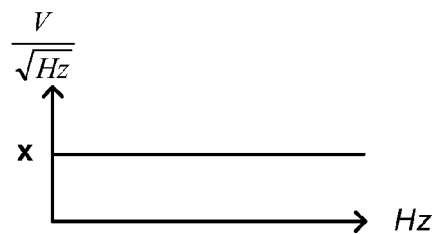
FIG. 3 illustrates a flat output voltage noise spectral density response obtained by the conventional instrumentation amplifier of FIG. 1, implemented using one of the exemplary multi-path amplifiers in FIGS. 2B and 2C with conventional transconductance and capacitor values. Ideal operational amplifiers with infinite bandwidth are assumed for the purpose of this illustration. It is also assumed that the low frequency (e.g. 1/f) noise is negligible, which can be achieved using circuit techniques such as chopping.
Figure 9A:
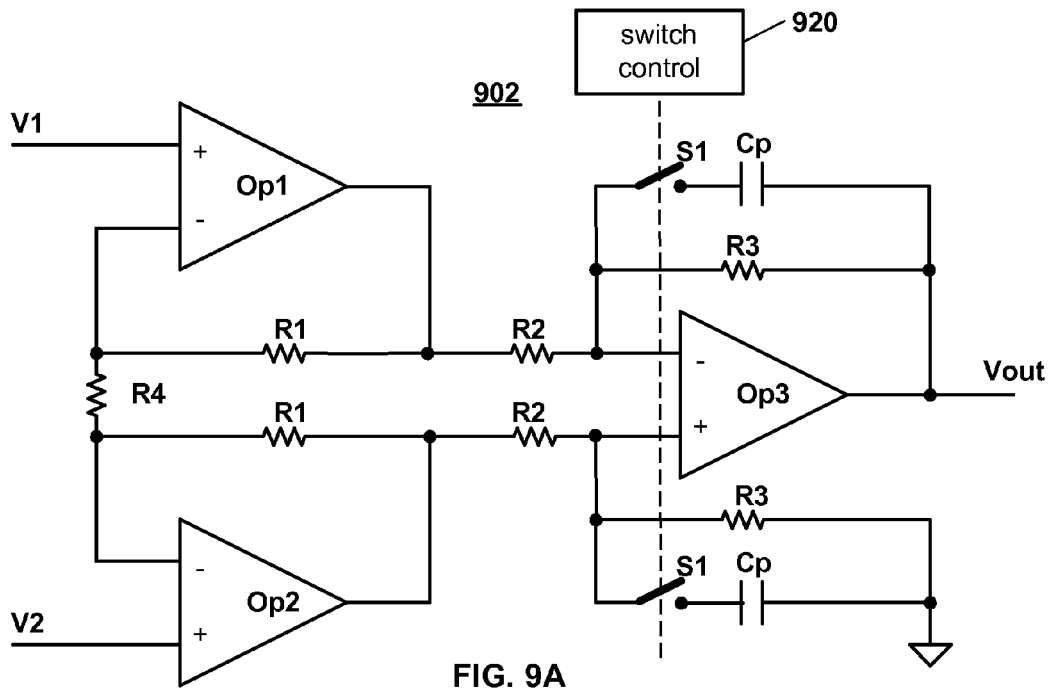
FIGS. 9A and 9B are used to illustrate an instrumentation amplifier that can be selectively switched between having the flat response of FIG. 3 and a noise shaping and band limiting response, e.g., the response (c) of FIG. 8, in accordance with an embodiment of the present invention.
Figure 9B:
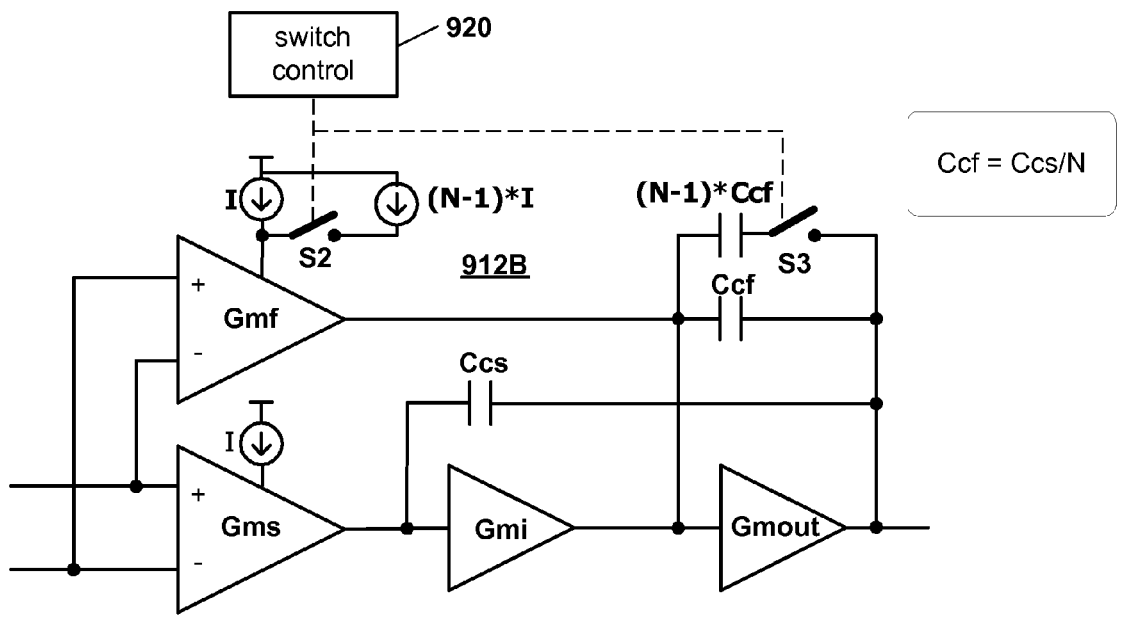

FIGS. 9A and 9B are used to illustrate an instrumentation amplifier 902 that can be selectively switched between having the flat response of FIG. 3 and a noise shaping and band limiting response, e.g., the response (c) of FIG. 8. FIG. 9B illustrates an exemplary multi-path amplifier that can be used to implement each of operational amplifiers (i.e., Op1, Op2 and Op3) in FIG. 9A, but embodiments of the present invention should not be limited to only these specific configurations. When the switches S1 are open (in FIG. 9A) and the switches S2 and S3 (in FIG. 9B) are closed, the instrumentation amplifier 902 will be configured to have the same configuration as instrumentation amplifier 102 (in FIG. 1), with each of the three operational amplifiers configures as the multi-path amplifier 212B (in FIG. 2B), resulting in a flat noise spectral density response resembling FIG. 3. When the switches S1 are closed (in FIG. 9A) and the switches S2 and S3 (in FIG. 9B) are opened, the instrumentation amplifier 902 will be configured as the instrumentation amplifier 402 (in FIG. 4), with each of the three operational amplifiers configured as the multi-path amplifier 612B (in FIG. 6B), resulting in noise shaping and band limiting, e.g., the frequency response (c) of FIG. 8. This enables a user to select between a flat frequency response (resembling FIG. 3) and a noise shaping and band limited frequency response (e.g., resembling (c) of FIG. 8) that consumes less power, depending upon the needs of the user.

A controller 920, which can be used to control the switches S1, S2 and S3, can be implemented, e.g., using logic, a processor, and/or a state machine. In an embodiment, the switches S1, S2 and S3 can be controlled by connecting a pin of an integrated circuit (implementing an embodiment of the present invention) to either a high or low voltage rail. The connecting of such a pin to either a high or low voltage rail can be a one time connection, or the connection can be changed (e.g., by a processor, through programming, or manually).

The switches S1, S2 and S3 can be implemented, e.g., using transistors. For example, the switches S1 can be implemented by N-channel transistors, and the switches S2 and S3 can be implemented by P-channel transistors, so that when a pin controlling the switches is low, the instrumentation amplifier 902 will have a flat response, and when the pin controlling the switches is high, the instrumentation amplifier 902 will have the frequency response (c) of FIG. 8. Numerous other configures are possible, and within the scope of the present invention.

An instrumentation amplifier that includes band pass limiting and noise-shaping, in accordance with an embodiment of the present invention, can be used to provide the same output noise within the frequency band of interest as a conventional instrumentation amplifier, but with significant current and power savings in the input transconductance. This input transconductance will often consume a large proportion of the overall power in a low noise design. Additionally, within the frequency band of interest, DC gain and slew capability are maintained. Thus, embodiments of the present invention can be used to provide significant improvement in noise versus power tradeoff for an instrumentation amplifier.

The use of alternative multi-path amplifiers (i.e., other than the ones shown in the FIGS.) are also within the scope of the present invention. For example, additional transconductance stages can be added. For other examples, one or more choppers can be added within the low frequency path of each multi-path amplifier to provide chopper stabilization, and/or a filter (e.g., a continuous time notch filter) can be added within each low frequency path, as disclosed in U.S. patent application Ser. No. 12/144,384, entitled "Chopper Stabilized Amplifiers" (Luff), filed Jun. 23, 2008, which is incorporated herein by reference.

In some embodiments, the instrumentation amplifiers of embodiments of the present invention can be implemented using discrete circuitry, e.g., discrete operational amplifiers, resistors, capacitors, and the like. In other embodiments, the instrumentation amplifiers of embodiments of the present invention can be implemented as integrated circuits, which may or may not be part of larger integrated circuits.

Figure 10:
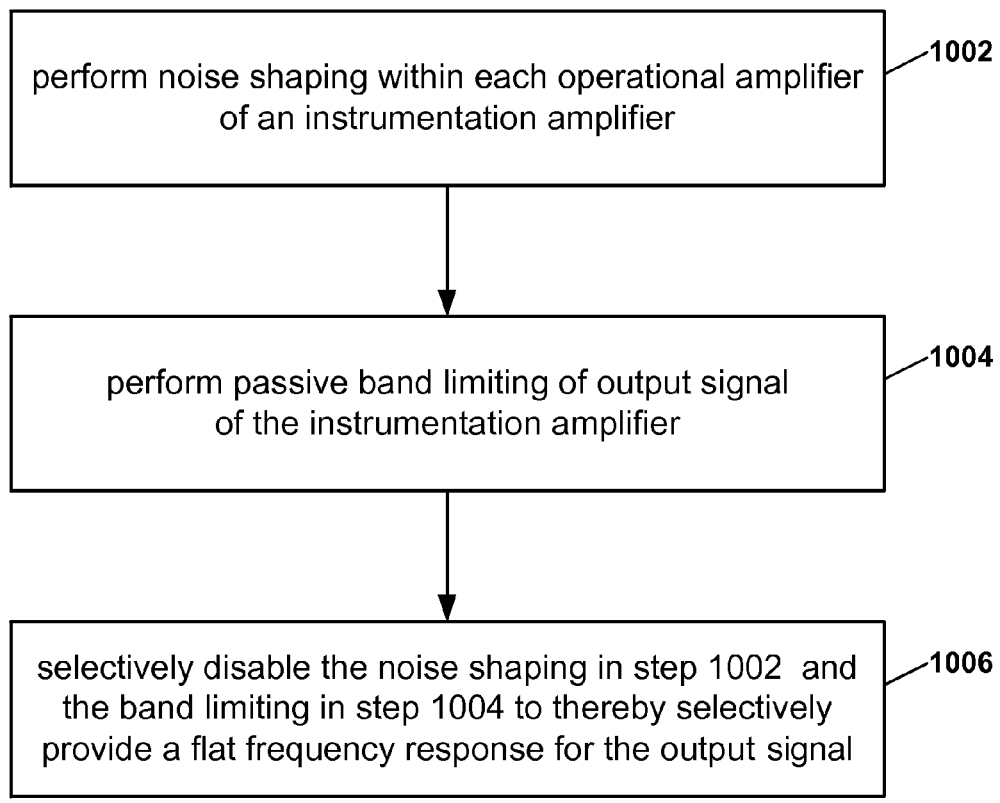
FIG. 10 is a high level flow diagram of a method for performing noise shaping and band limiting, in accordance with an embodiment of the present invention.

FIG. 10 is a high level flow diagram of a method for performing noise shaping and band limiting, in accordance with an embodiment of the present invention. This method is for use with an instrumentation amplifier including a pair of buffered operational amplifiers (e.g., OP1 and OP2 in FIG. 4) that accept a pair of input signals V1 and V2, and a differential operational amplifier (e.g., OP3 in FIG. 4) that outputs an output signal Vout indicative of a difference between the pair of input signals V1 and V2. Referring to FIG. 10, at step 1002, noise shaping is performed within each of the operational amplifiers (e.g., OP1, OP2 and OP3 in FIG. 4), which results in an increase in noise above a crossover frequency. As was explain above, such noise shaping can be performed by appropriate ratioing of input transconductance stages (e.g., Gms and Gmf) within the operations amplifiers implemented as multi-path amplifiers, and appropriate ratioing of capacitors (e.g., Ccs and Ccf) within the multi-path amplifiers. As indicated at step 1004, passive band limiting of the output signal Vout is performed (e.g., using capacitors Cp in FIG. 4) to thereby filter out noise above a cutoff frequency. For the reasons explain above, less current and power is drawn when such noise shaping and band limiting is performed, as compared to when the circuit provides a flat frequency response for the output signal Vout.

As was explained above, in accordance with an embodiment, the cutoff frequency in step 1004 is equal to the crossover frequency in step 1002. In another embodiment, cutoff frequency in step 1004 is less than the crossover frequency in step 1002. In still another embodiment, the cutoff frequency in step 1004 is greater than the crossover frequency in step 1002.

In accordance with an embodiment, the noise shaping in step 1002 and the band limiting in step 1004 can be selectively disabled, e.g., using switches, to thereby selectively provide a flat frequency response for the output signal Vout, as indicated at step 1006.

Embodiments of the present invention have been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art, and are within the scope of the present invention.

Embodiments were chosen and described in order to best describe the principles of the invention and its practical application, thereby enabling others skilled in the art to understand the invention. It is intended that the scope of the invention be defined by the following claims and their equivalents.

What is claimed:

1. A circuit, comprising:
    an instrumentation amplifier including a pair of buffered operational amplifiers that accept a pair of input signals, and a differential operational amplifier that outputs an output signal indicative of a difference between the pair of input signals; and
    a low pass filter configured to provide band limiting of the output signal;
    wherein each of the buffered operational amplifiers and the differential operational amplifier are implemented as a multi-path amplifier that includes a low frequency path and a high frequency path between an input and an output of the operational amplifier;
    wherein each of the multi-path amplifiers includes a differential input transconductance stage within the low frequency path and a differential input transconductance stage within the high frequency path; and
    wherein, within each of the multi-path amplifiers, the differential input transconductance stage of the high frequency path is noisier than, but consumes less power than, the differential input transconductance stage of the low frequency path.

2. The circuit of claim 1, each of the multi-path amplifiers is configured to provide noise shaping that results in an increase in noise above a crossover frequency of the multi-path amplifier.

3. The circuit of claim 2, further comprising switches configured to selectively disable the band limiting provided by the low pass filter and the noise shaping provided by the multi-path amplifiers, to thereby selectively provide a flat frequency response for the output signal.

4. The circuit of claim 3, further comprising a controller configured to control the switches.

5. The circuit of claim 3, wherein less current and power is drawn when the circuit provides noise shaping and band limiting, as compared to when the circuit provides a flat frequency response for the output signal.

6. The circuit of claim 1, wherein the band limiting provided by the low pass filter filters out noise above a frequency of interest so that at least a majority of noise generated by the differential input transconductance stage of the high frequency path is filtered out.

7. The circuit of claim 1, wherein the output signal comprises a differential output signal.

8. The circuit of claim 1, wherein one or more passive components of the low pass filter specifies the low pass cutoff frequency as being equal to a crossover frequency defined in part by the transconductances of the multi-path amplifiers.

9. The circuit of claim 1, wherein one or more passive components of the low pass filter specifies the low pass cutoff frequency as being less than a crossover frequency defined in part by the transconductances of the multi-path amplifiers.

10. The circuit of claim 1, wherein one or more passive components of the low pass filter specifies the low pass cutoff frequency as being greater than a crossover frequency defined in part by the transconductances of the multi-path amplifiers.

11. A method for use with an instrumentation amplifier including a pair of buffered operational amplifiers that accept a pair of input signals, and a differential operational amplifier that outputs an output signal indicative of a difference between the pair of input signals, the method comprising:
    (a) performing noise shaping within each of the operational amplifiers of the instrumentation amplifier, which results in an increase in noise above a crossover frequency; and
    (b) performing passive band limiting of the output signal to thereby filter out noise above a cutoff frequency.

12. The method of claim 11, wherein the cutoff frequency in step (b) is equal to the crossover frequency in step (a).

13. The method of claim 11, wherein the cutoff frequency in step (b) is less than the crossover frequency in step (a).

14. The method of claim 11, wherein the cutoff frequency in step (b) is greater than the crossover frequency in step (a).

15. The method of claim 11, further comprising:
    (c) selectively disabling the noise shaping in step (a) and the band limiting in step (b) to thereby provide a flat frequency response for the output signal.

16. The method of claim 15, wherein less current and power is drawn when noise shaping and band limiting are performed at steps (a) and (b), as compared to when the flat frequency response for the output signal is selectively provided at step (c).

17. A circuit, comprising:
    a first operational amplifier configured as a buffer, and including an input that accepts a first input signal and including an output;
    a second operational amplifier configured as a buffer, and including an input that accepts a second input signal and including an output;
    a third operational amplifier configured as differential amplifier and including an inverting input, a non-inverting input, and an output;
    a first resistor connecting the output of the first operational amplifier to the inverting input of the third operational amplifier;
    a second resistor connecting the output of the second operational amplifier to the non-inverting input of the third operational amplifier; and
    a low pass filter configured to band limit an output signal, indicative of a difference between the pair of input signals, provided at the output of the third operational amplifier;
    wherein each of the first, second and third operational amplifiers comprises a multi-path amplifier including a low frequency path and a high frequency path, with the low frequency path including an input transconductance stage (Gms) and the high frequency path including an input transconductance stage (Gmf), and with capacitors (Ccs and Ccf) that provide parallel integration paths for the low and high frequency paths; and
    wherein $Gmf=Gms/N$ and $Ccs=Ccf/N$, where $N>1$.

18. The circuit of claim 17, wherein noise shaping occurs within each of the multi-path operational amplifiers because $Gmf=Gms/N$ and $Ccs=Ccf/N$, where $N>1$.

19. The circuit of claim 18, wherein the band limiting filters out frequencies below a low pass cutoff frequency, and the noise shaping causes an increase in noise within the operational amplifiers above a crossover frequency.

20. The circuit of claim 19, wherein the cutoff frequency is equal to the crossover frequency.

21. The circuit of claim 19, wherein the cutoff frequency is less than the crossover frequency.

22. The circuit of claim 19, wherein the cutoff frequency is greater than the crossover frequency.

23. The circuit of claim 19, wherein the output signal comprises a differential output signal.

* * * * *